United States Patent [19]

Kelly et al.

[11] 4,321,530

[45] Mar. 23, 1982

[54] MULTIMETER WITH TONE INDICATION

[75] Inventors: Austin T. Kelly, Morris Plains; Philip Emile, Jr., Roseland; Alan H. Stolpen, Union, all of N.J.

[73] Assignee: Sangamo Weston, Inc., Norcross, Ga.

[21] Appl. No.: 56,729

[22] Filed: Jul. 11, 1979

[51] Int. Cl.³ .................. G01R 15/08; G01R 19/16
[52] U.S. Cl. .................................. 324/115; 324/133
[58] Field of Search .................. 324/115, 157, 133; 340/661, 662, 663

[56] References Cited

U.S. PATENT DOCUMENTS

| | | |
|---|---|---|
| 2,780,709 | 2/1957 | Thompson et al. |
| 3,081,431 | 3/1963 | Werner et al. |
| 3,169,819 | 2/1965 | Valentine |
| 3,204,183 | 8/1965 | Hasenzahl |
| 3,237,102 | 2/1966 | Newell ............................ 324/115 |
| 3,300,659 | 1/1967 | Watters |
| 3,332,014 | 7/1967 | Orths et al. |
| 3,439,228 | 4/1969 | Gormley |
| 3,444,467 | 5/1969 | Cliffgard |
| 3,513,393 | 5/1970 | Myers |
| 3,519,807 | 7/1970 | Jacques et al. |
| 3,546,587 | 12/1970 | Turecek |
| 3,579,223 | 5/1971 | McKaig |
| 3,582,777 | 6/1971 | Wunderman ..................... 324/115 |
| 3,663,958 | 5/1972 | Crane |
| 3,671,863 | 6/1972 | Rhyne, Jr. |
| 3,699,432 | 10/1972 | Brown |
| 3,715,661 | 2/1973 | Posey et al. |
| 3,774,110 | 11/1973 | Roveti |
| 3,828,252 | 7/1974 | Wolff |
| 3,903,471 | 9/1975 | Hiraga et al. |
| 3,944,921 | 3/1976 | Tsuda et al. |
| 3,999,124 | 12/1976 | Haney |
| 4,051,333 | 9/1977 | Schomburg |
| 4,096,434 | 1/1978 | Meyer ............................. 324/115 |

Primary Examiner—Ernest F. Karlsen
Attorney, Agent, or Firm—Joseph J. Kaliko; Mikio Ishimaru; Dale V. Gaudier

[57] ABSTRACT

A digital multimeter having a tone generating circuitry and operable in a tone mode of operation for providing an audible indication when a measured electrical characteristic has a predetermined relationship with a reference value. The audible indication may be provided when a voltage level exceeds a preselectable limit, such as 1 or 2 volts. Predetermined limits for resistance values may also be selected for actuation of the audible tone. The device may be utilized as a conventional multimeter when the tone mode is non-operative.

10 Claims, 6 Drawing Figures

| DIGITS | SEGMENTS<br>a b c d e f g | MINIMUM EQN. |
|---|---|---|
| 1 |   o o | $\overline{A}\cdot\overline{F}$ or $\overline{A}\cdot\overline{G}$ |
| 2 | o o   o o  o | $\overline{C}$ |
| 3 | o o o o     o | |
| 4 |   o o     o o | $\overline{A}\cdot F$ or $\overline{A}\cdot G$ |
| 5 | o   o o   o o | |
| 6 | o   o o o o o | |
| 7 | o o o | |
| 8 | o o o o o o o | |
| 9 | o o o o   o o | |
| 0 | o o o o o o | $F\cdot\overline{G}$ |

MULTIMETER WITH TONE INDICATION

BACKGROUND OF THE INVENTION

1. Field of the Invention

The invention is in the field of portable multimeters, particularly digital multimeters for measuring voltage, current and resistance values.

2. Description of the Prior Art

Portable meters suitable for measuring various electrical quantities have been widely utilized for many years. The versatility of the current state of the art digital multimeter is particularly advantageous, since it provides a selectable range for measurements of voltage, current and resistance values utilizing the same basic electronic components, namely, a voltage dividing chain, analog-to-digital converter and digital display. Representative examples of such multimeters are shown by Weston Instruments Models 4440-4448 and 6000, and Fluke Model 8020A. In such multimeters, the readout mechanism is in the form of a digital display, and the operator must necessarily view the display in order to obtain any indication of the value being measured. In some situations, however, it is advantageous to provide a tone indication related to the value being measured such that measurements may be made more readily and without the necessity of continually watching the display. This is particularly important, for example, in continuity testing of cables and printed circuit boards wherein the operator is interested in ascertaining, for example, whether circuit points are connected by resistance values less than predetermined amounts, for example, 1 ohm. In such situations, the exact value of the quantity being measured is not as important as whether the value is below an upper predetermined amount. Continuity checkers per se provided with an audible alarm are known from the prior art as, for example, Model ACT-1 from Calcomp Consumer Products, Inc. Such continuity checkers, however, are not incorporated within a digital multimeter, but provide a stand-along device which generates a tone frequency output which has no quantitative relationship with the resistance value being measured. Moreover, in such prior art devices, it is not possible to vary the threshold of the measuring circuitry, and thus, it is not possible to ascertain from the existence of the audible tone whether the resistance value being measured is above or below a given selectable threshold.

SUMMARY OF THE INVENTION

It is an object of the invention to overcome the disadvantages of the prior art by providing a tone output indicator incorporated within a multimeter. It is a specific object of the invention to provide a tone indicator for a digital multimeter wherein the tone is generated whenever the value being measured is below predetermined and selectable threshold levels of the electrical quantities being measured.

In accordance with the invention, a tone generating circuitry is provided in a digital multimeter such that the tone is generated during a tone mode of operation whereas the multimeter may otherwise be utilized in a conventional fashion to measure voltage, current or resistance values. In the tone mode of operation, it is possible, for example, to generate the tone whenever the resistance value being measured is below selectable limits of 1, 10 or 100 ohms or whenever the voltage level being measured is below, for example, preselected limits of 1 or 2 volts. Accuracy of these upper discrimination levels may be made precise inasmuch as, in the tone mode, use is made of the same voltage dividing chain of precision resistors as is employed in measurements of voltage, current and resistance values.

In a preferred embodiment of the invention, a digital multimeter is provided for use in measuring electrical characteristics, such as voltage, current and resistance values, and comprises a plurality of scaling resistors and input terminals for connection of the scaling resistors in a measurement circuit for measurement of the electrical characteristic, an analog-to-digital converter means for converting an analog voltage from the measurement circuit to a digital value representative of the electrical characteristic being measured, means connected to the analog-to-digital converter means for displaying the digital value, scale change means connected to the measurement circuit for enabling selection of different full-scale readings of the display means, mode selection means connected to the measurement circuit for selecting operation of the multimeter in a tone mode of operation, and means for generating an audible tone in the tone mode of operation when the measured electrical characteristic bears a predetermined relationship with a predetermined, reference value. The predetermined relationship may be simply that the value being measured is less than the predetermined reference value. The predetermined reference value may simply be a percentage of the full-scale reading of the meter as selected by the scale change selection means.

BRIEF DESCRIPTION OF THE DRAWINGS

The invention is further described in reference to the following description taken in conjunction with the drawings wherein.

DETAILED DESCRIPTION OF A PREFERRED EMBODIMENT

Figure 1:
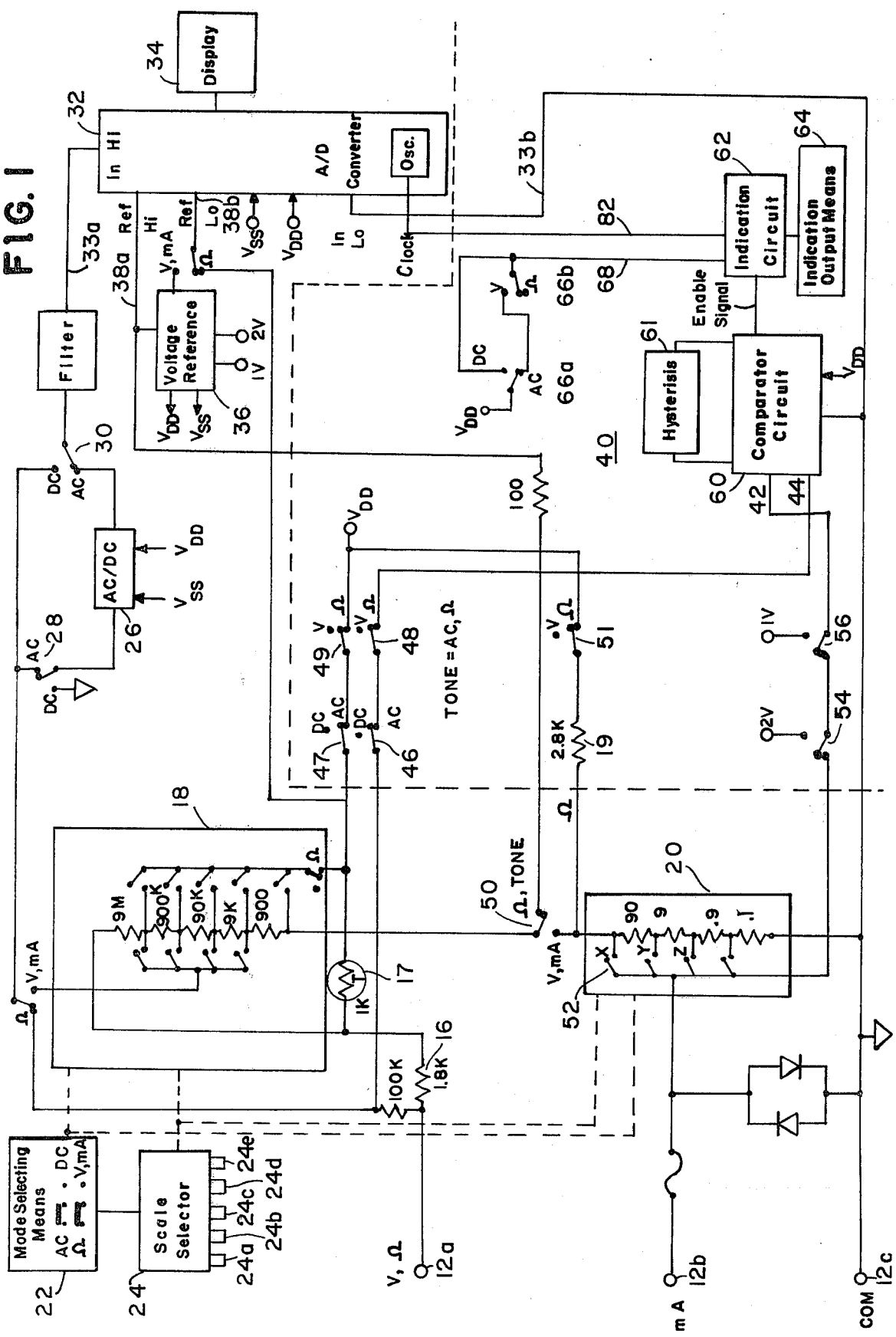
FIG. 1 is a block diagram of the digital multimeter made in accordance with the invention.

FIG. 1 illustrates an overall block diagram of a multimeter 10 made in accordance with the principles of the invention. The elements positioned to the left and top of dotted line A—A are typical of circuit components found in prior art digital multimeters. The tone generating apparatus is illustrated to the right and bottom of dotted line A—A. The multimeter 10 is seen to comprise input terminals 12a, 12b and 12c. Terminal 12a is utilized for voltage and resistance measurements, whereas terminal 12b for current measurements. Input terminal 12c is the common terminal connected to analog ground. Multimeter 10 is further seen to comprise an upper voltage divider 18 connected to terminal 12a and a lower voltage divider 20 connected to terminal 12c. The upper voltage divider may typically comprise scaling resistors in the form of a precision resistor chain having resistor values of, for example, 9M, 900K, 90K, 9K and 900 ohms; and similarly, the lower voltage divider 20 may comprise a precision resistor chain having values of 90, 9, 0.9 and 0.1 ohms. Interlocking push-button switches are provided in the multimeter to connect points between these discrete resistors to effect a scale change in measurements of voltage, current and resistance. Typically, push-button switches may be provided both to select the mode of operation of the multimeter and the full scale value of the quantity being measured. FIG. 1 illustrates a mode selection means 22 which comprises two pushbutton switches, each switch connecting two of three possible terminals. The upper push-button switch, when moved to the leftmost position (illustrated) places the multimeter in an AC mode of operation applicable for measuring AC voltages or currents. In the rightmost position of this switch, the multimeter is placed in a DC mode of operation applicable for measuring DC voltages or currents or for measuring resistance values. The lower illustrated push button of the mode selection means 22 is shown in the leftmost position for measuring resistance values and may be moved to the rightmost position for measuring voltage or current values. Typically, the position illustrated, namely, AC/ohms, is not utilized in prior art devices. In accordance with the principles of the invention, however, the AC/ohms position is utilized to provide a tone mode of operation as described in detail hereinbelow.

The mode selection means 22 is interconnected to a scale or range selector 24 which may comprise a plurality of interlocking push buttons 24a, 24b, 24c, 24d and 24e for selecting appropriate scales for voltage, current or resistance values, as is well known in the art. The scale selector 24 and mode selection means 22 are interconnected to the upper and lower voltage dividers 18 and 20 in conventional fashion to provide the desired mode of operation and scale reading for the electrical quantity being measured.

FIG. 1 also illustrates various other components of the multimeter which are utilized to provide a digital readout of the selected voltage, current or resistance value. Thus, the voltage divider chains 18 and 20 are connected to an AC/DC converter 26 by means of AC/DC switches 28 and 30 controlled by the mode selection means 22. All inputs other than DC volts are converted to DC volts for measurement. An analog-to-digital converter 32 is provided to digitize the incoming voltage signal along its input high line 33a. Input low is fed from common terminal 12c to the IN LO input of the analog-to-digital converter 32 along a line 33b. The analog-to-digital converter is connected to a digital display 34 for providing a visual indication of the voltage, current or resistance value being measured. A reference voltage source 36 is also provided to supply reference voltages to various electrical components of the multimeter. For example, voltages $V_{DD}$ (2.8 v) and $V_{SS}$ (−6.2 v) are provided to the AC/DC converter 26 and analog-to-digital converter 32. Further, a plurality of other reference voltage signals are generally provided to the analog-to-digital converter 32 as indicated by reference voltage lines 38a and 38b. For ease of portability, the reference voltage source may comprise a battery and a voltage divider circuit to derive the appropriate voltage levels.

The elements described hereinabove are typical of prior art digital multimeters as illustrated, for example, by the Weston Instruments, Inc. Model 4442 and Data Precision Model 935.

The novel combination in accordance with the principles of the invention is shown in FIG. 1 by a level discrimination and tone generation circuit 40 interconnected to the prior art digital multimeter. The interconnection of the level discrimination and tone generation circuit 40 is simplified inasmuch as use is made of the typically unused AC/ohms switch availablilty in the mode selection means 22. When the mode selection means 22 is placed in the AC/ohms position, as illustrated in FIG. 1, the tone mode of operation is activated, and input lines 42 and 44 of the level discrimination and tone generation circuit 40 are connected by means of switches 46, 48, 54 and 56 to a bridge network consisting of reference resistors 16, 17 and 19, lower voltage divider 20 and the unknown input at terminals 12. Positioning of the mode selection means 22 in any position other than the AC/ohms position effectively removes the level discrimination and tone generation circuit 40 from the remaining components of the multimeter 10 as illustrated by the series connection of switches 46 and 48 and 47 and 49. A switch 50 is also provided to effectively disconnect the upper voltage divider 18 from the lower voltage divider 20 during the tone mode of operation, and a switch 51 is provided to remove the reference voltage $V_{DD}$ from the lower voltage divider 20, except during a resistance (ohm) or tone mode of operation. Switches 46, 47, 48, 49, 50 and 51 are all connected to and actuated by the mode selection means 22. Thus, during the tone mode of operation, the bridge network is seen to comprise only the lower voltage divider 20 and reference resistor 19 forming one leg thereof, and the unknown resistance value between the input terminals 12a and 12c together with reference resistors 16 and 17 forming the other leg thereof. A switch set 52 is connected between terminals of the lower voltage divider 20 to select the appropriate scale value for the value being measured. Typically, the switch set 52 is part of the scale selector 24, and is connected by depression of push buttons 24c, 24d or 24e.

The reference voltage source 36 is also utilized to provide additional reference voltages to line 42 of the level discrimination and tone generation circuit 40. For example, switch 54 may be positioned to provide a 2 volt reference voltage source to line 42, and switch 56 may be positioned to connect a 1 volt voltage source to line 42. Switches 54 and 56 are preferably actuated by push buttons 24a and 24b on the scale selector 24, inasmuch as these push buttons are not otherwise committed during the tone (AC/ohms) mode of operation.

The level discrimination and tone generation circuit 40 is seen to comprise a comparator circuit 60 with hysteresis circuit 61, an indicator circuit 62 and an indication output means 64. The comparator circuit 60 compares the inputs thereto along lines 42 and 44 and provides an enable signal whenever the voltage on reference line 42 is lower than the voltage on input line 44. The enable signal is utilized by the indicator circuit 62 to activate the indication means 64 which may take the form of a small speaker, buzzer or suitable tone generating device. The indicator circuit 62 is inhibited from operation when the tone mode is not desired by means of switches 66a and 66b which provide a tone inhibit signal along line 68. Switches 66a and 66b are connected with and actuated by mode selection means 22.

FIG. 1 illustrates the level discrimination and tone generation circuit 40 interconnected to provide an audible indication whenever the resistance value being measured is below a selectable, predetermined upper resistance limit, such as 100 ohms, 10 ohms, or 1 ohm. Switch set 52 is positionable at terminals X, Y and Z to provide the 100 ohm, 10 ohm or 1 ohm selection respectively. Further, the level discrimination and tone generation circuit 40 may be utilized to provide an audible indication if the voltage value being measured is below preselectable voltage limits, for example, 2 volts or 1 volt. Switch 54 is connected to the volt terminal whenever it is desired to provide an audible tone if the voltage being measured is below 2 volts, and switch 56 is connected to the 1 volt terminal if the tone is desired whenever the measured voltage is below 1 volt. Push buttons 24a and 24b correspond respectively to switches 56 and 54 and establish a 1 volt or 2 volt reference level for the comparator circuit 60. Depression of push buttons 24c, 24d and 24e correspond respectively to positioning switch set 52 and terminals Z, Y and X to establish upper resistance limits of 1, 10 and 100 ohms. Inasmuch as the push buttons 24a . . . 24e are interlocking, depression of one releases all others.

It is possible, of course, to utilize the comparator circuit 60 to provide an enable signal whenever the unknown voltage is above a preselected resistance or voltage level if desired. In this case, a crossover switch effectively exchanging the input lines 42 and 44 could be utilized. Further, it is clear that the level discrimination and tone generation circuit 40 could also be utilized to provide an audible indication whenever a current value being measured via terminals 12b and 12c is selectively above or below a predetermined selectable level determined by a resistor placed between terminals 12a and 12c.

Figure 2:
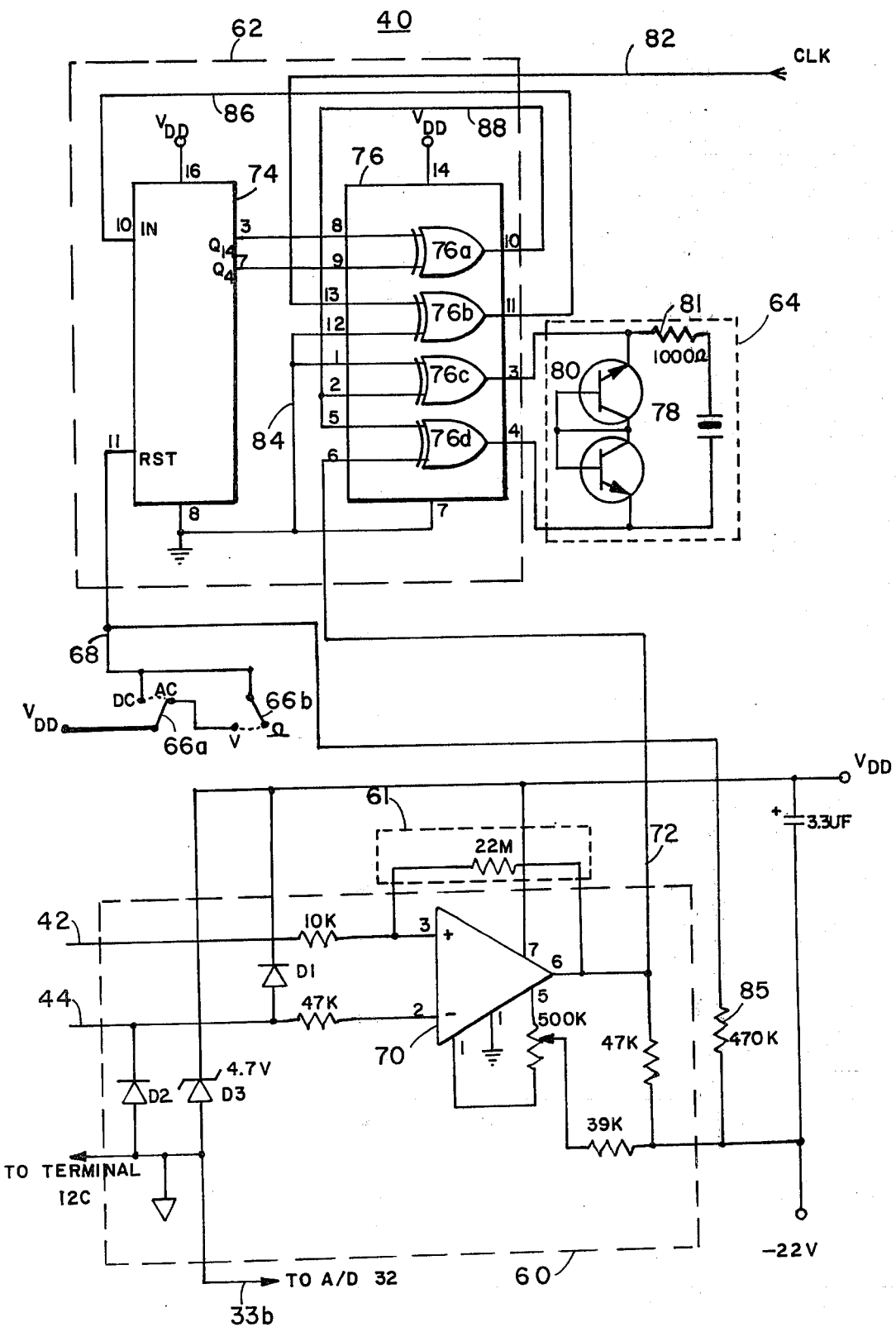
FIG. 2 is a detailed schematic diagram of the level discrimination and tone generation circuit of FIG. 1.

A more detailed circuit diagram of the level descrimination and tone generation circuit 40 is illustrated in FIG. 2. Comparator circuit 60 comprises a voltage comparator 70 which is most preferably fabricated by adding the hysteresis circuit 61 (feedback resistance) to a micropower amplifier such as Texas Instruments Model TL061. Comparator 70 has its non-inverting input connected to the reference input line 42 and its inverting input connected to the input line 44. Transient protection is provided by means of diodes D1, D2 and Zener diode D3. The output of the voltage comparator 70 is taken along line 72 to the indicator circuit 62. Indicator circuit 62 is seen to comprise a binary division circuit 74 (for example, RCA Model No. CD4020B) and a quad, exclusive-OR (EOR) gate 76 (for example, Model CD4030B). The EOR gate 76 comprises four individual EOR gates 76a, 76b, 76c and 76d, as shown. The indication means 64 is shown as a piezoceramic disk (for example, Panasonic Model No. EFBS73D01L). Circuit protection for the EOR gate 76 is provided by means of the transistor pair 80 (Model No. 2N3904, for example) and resistor 81.

Line 82 provides a clock connection from the analog-to-digital converter 32 to one input of EOR gate 76b. The other input of EOR gate 76b is held low by grounding (−2.2 v) same via line 84. Consequently, EOR gate 76b serves as a buffer and provides an output at the same clock rate as its input which may be, for example, 40 KHz. The output of EOR gate 76b is fed via a line 86 to the input of the binary division circuit 74. The Q14 output of the binary division circuit 74 divides the input signal by $2^{14}$ to provide an output signal at about 2.4 Hz. The Q4 output of the binary division circuit 74 divides the input frequency by $2^4$, thereby providing an output at 2.5 KHz. The two outputs Q4 and Q14 of the binary division circuit 74 are fed to EOR gate 76a which thereby provides an output along line 88 to the lower input of EOR gate 76c and to the upper input of EOR gate 76d. The effect of the EOR gate 76a is to combine the two input frequencies to provide two different output frequencies, wherein one beat of the higher frequency input signal (2.5 KHz) is skipped at a rate of the lower frequency input signal (2.4 KHz). The upper input of EOR gate 76c is grounded via line 84. The outputs of EOR gates 76c and 76d are connected to the piezoceramic disk 78. The lower input of EOR gate 76d is connected via the line 72 to the voltage comparator 70. Whenever the output of voltage comparator 70 goes high (indicating that the non-inverting input voltage is greater than the inverting input voltage), the piezoceramic disk 78 is energized and an audible tone is emitted at the same frequency as that provided by the output of EOR gate 76a. The generation of the audible tone from the piezoceramic disk 78 corresponds to an out-of-phase condition of the two EOR gates 76c and 76d. Whenever the output of the voltage comparator 70 goes low, however, the EOR gates 76c and 76d are gated to phase with one another, and consequently, there is no effective voltage applied for energizing the piezoceramic disk 78.

The output of binary division circuit 74 is inhibited by placing a positive input on its reset terminal via switches 66a, 66b and voltage $V_{DD}$. In the tone mode of operation, the reset terminal is held negative via a −2.2 v potential (used as digital ground) from the voltage reference source 36 and a resistor 85, as shown.

In operating the digital multimeter in the tone mode, it is merely necessary to place the mode selection means 22 in the AC/ohms position, as illustrated in FIG. 1. The operator may then utilize the push buttons 24a . . . 24e of the scale selector 24 to provide an upper limiting value for either voltage or resistance measurements. For example, if the operator desires to have a tone indication for resistance values less than 100 ohms, then push button 24e would be depressed, which would cause switch set 52 to be connected to the X terminal corresponding to a maximum range limit of 100 ohms. If the operator desires a 10 ohm range, push button 24d is depressed to interconnect switch set 52 to the Y terminal of the lower divider chain 20. If a 1 ohm range is desired, the operator merely depresses the push button 24c to interconnect switch set 52 to the Z terminal of the voltage divider 20. Pushbutton switches 24a and 24b correspond to the selection of a voltage range of 2 volts or 1 volt respectively. In each case, the voltage comparator 70 is utilized to provide an output signal along line 72 to place the output of the EOR gate 76d either in phase or out of phase with the output of EOR gate 76c. In the out-of-phase case, the piezoceramic disk 78 is energized, and in the in-phase case, no tone is generated. The binary division circuit 74, in combination with the EOR gate 76, generates a composite frequency signal having a beat at the frequency rate of the lower of the two division outputs Q4 and Q14 of the binary division circuit 74, namely, the 2.4 Hz frequency. This enables the operator of the multimeter to hear a distinct "clicking" sound at a nominal 2.4 Hz, which is useful in enabling a rough quantitative estimate of capacitor values utilizing an RC time constant consisting of resistors 16 and 17 and the unknown capacitor. The capacitive value is determined by counting the number of clicks it takes to charge the capacitor to the level set on comparator 60 by the setting of switches 52, 54 and 56. Once the capacitor is charged to that level, the tone will cease.

The particular type of analog-to-digital converter 32 and display 34 are not crucial to the practice of the invention. One suitable analog-to-digital converter is, for example, the dual slope converter manufactured by Intersil, Model ICL7106, and a suitable display may be one manufactured by Hamlin as Part No. 91939015. This particular A/D converter has its own power supply and internal oscillator providing an external clock terminal.

A particular advantage of the level discrimination and tone generating circuit 40 is in its fast response time. Typically, the audible tone is discernible within about 1 ms of measurement which makes the apparatus useful for measurement of AC and transient pulses, as well as DC levels. The AC signals effectively modulate the audible output of the piezoceramic disk 78.

Another particular advantage of the embodiment of FIGS. 1 and 2 is the accessibility via terminals 12a, 12b and 12c of the threshold determining resistor network for purposes of user adjustment and modification of the threshold level. For example, by adding a 100 ohm resistor across terminals 12b and 12c, positioning a switch 52 at the X terminal will change the threshold value from an upper limit of 100 ohms to an upper limit of 50 ohms, since the added resistor parallels the 100 ohm setting of the lower voltage divider 20.

Figure 3:
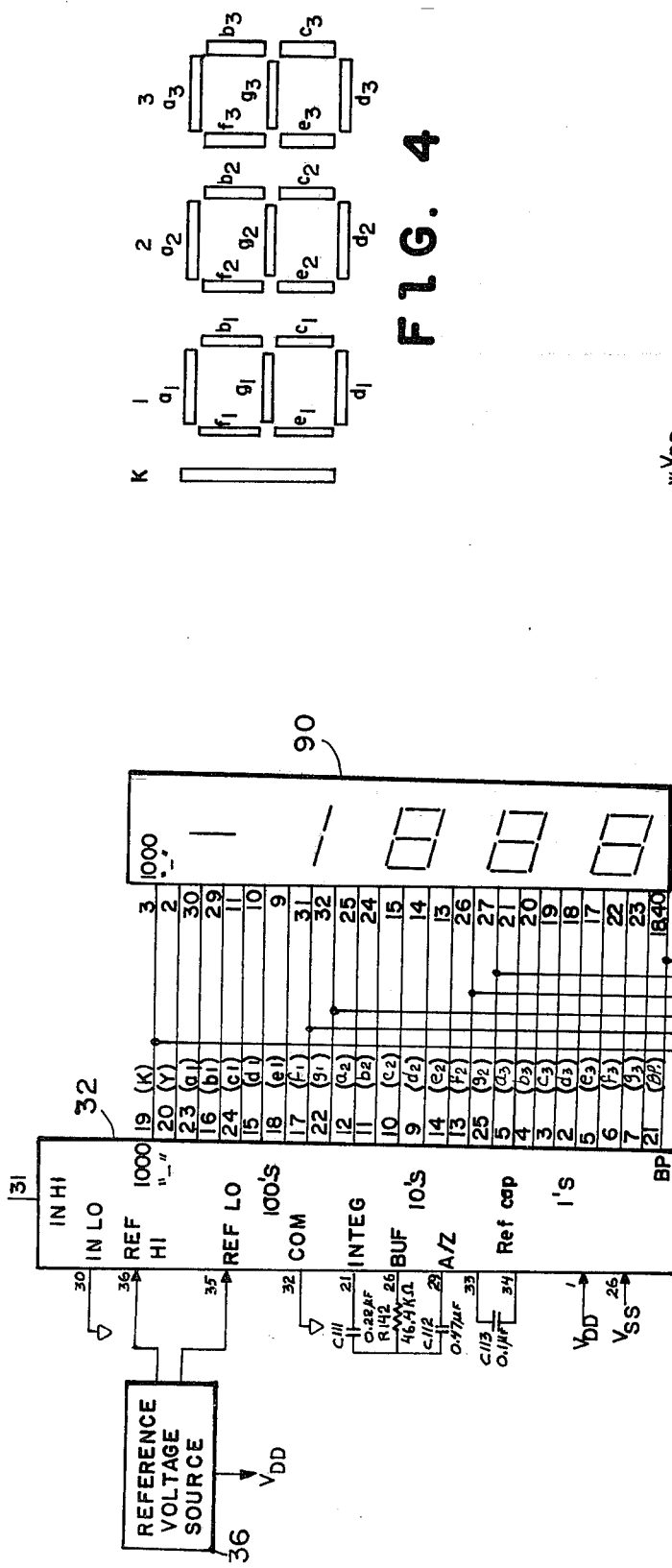
FIG. 3 illustrates a second embodiment of the invention wherein a decode logic circuitry is utilized to activate a tone generating device.
Figure 4:
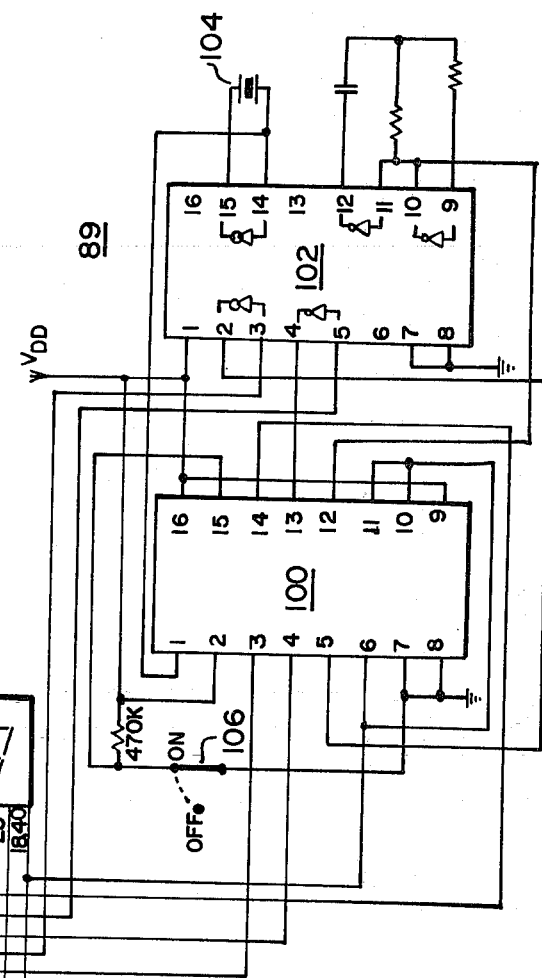
FIG. 4 shows a representative 3½ digit seven-segment display.
Figures 5, 6:
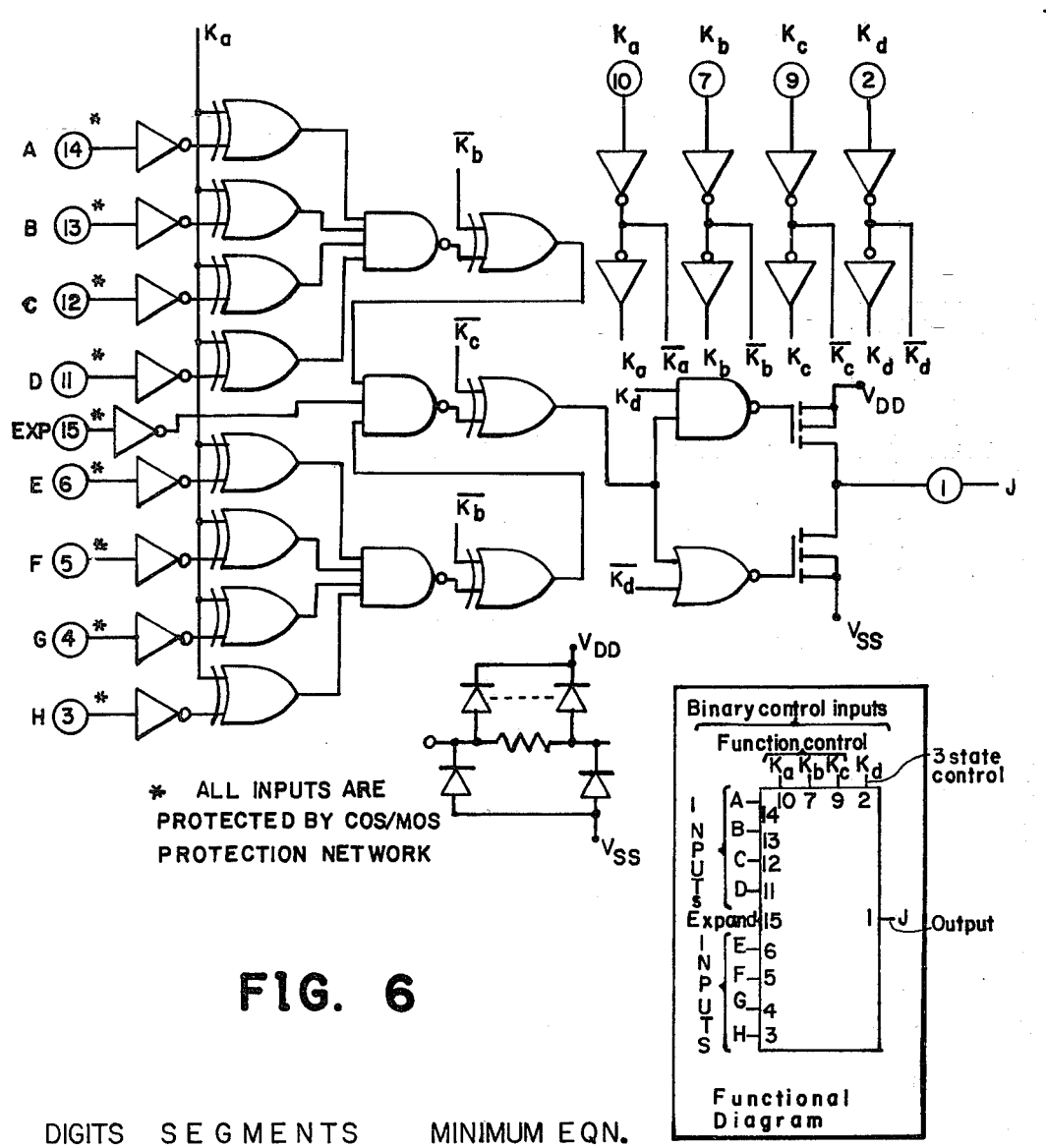
FIG. 5 is a diagram of typical logic requirements in a digit of the seven-segment display associated with selected displayed numerals.
FIG. 6 shows a detailed logic diagram of the combinational logic chip forming part of the decode logic of FIG. 3.

An alternate embodiment of the invention is illustrated in FIG. 3, wherein a display decode logic circuit 89 is utilized and the tone device is energized in response to a decode of the display outputs of the analog-to-digital converter 32. In this embodiment of the invention, the level discrimination and tone generating circuit 40 of FIG. 1 is not utilized, although the basic components to the left of line A—A remain the same. An audible indication is provided after conversion of the analog voltage (representative of the voltage, current or resistance being measured) by the A/D converter 32. In the preferred embodiment of the invention, a dual slope analog-to-digital converter is utilized, such as the above-mentioned Intersil Model ICL7106, as illustrated in FIG. 3. The output pins of the analog-to-digital converter 32 may be fed to display 34 such as a 3½ digit LCD display 90 (Hamlin, Part No. 91939015). The display outputs of the converter are appropriately labeled a1, b1 . . . g1, a2, b2 . . . g2, a3, b3 . . . g3, and BP (back plane). The letter designations correspond to the segmens of each of the three digits in the display as illustrated in FIG. 4. The overrange indicator 1 is energized by the k (pin 19) output of the analog-to-digital converter. Any desirable decode requirement may be selected, and it is convenient to initiate an audible tone whenever the measured quantity is less than 1% of the full scale reading of the meter. This requirement may be effected by initiating the tone whenever the display reads " _ 00X", where the "X" indicates a don't care condition and " _ " indicates that the overrange segment is off. The circuit of FIG. 3 is designed specifically to detect the " _ 00X" condition utilizing a minimum of circuit components. For this purpose, a typical analysis of the required segments to be monitored may be as shown in FIG. 5, which illustrates the segments of a seven-segment display which are energized to display a version of the numerals 0, 1 . . . 9. From FIGS. 4 and 5, it is seen that a minimum segment detection requirement for detecting the " _ 00X" condition is: $\overline{K}\cdot(F_1\cdot\overline{G}_1)\cdot(F_2\cdot\overline{G}_2)$. The segment detection may be implemented by exclusive OR-ing the minimum requirement stated above with the back plane signal ($\overline{BP}$) to the LCD display 90. Inasmuch as display 90 operates in the "on" condition when the back plane signal is out of phase with the segment to be energized, the BP signal is utilized in the exclusive-OR circuitry. Thus, the desired logic equation which is implemented by the logic components of FIG. 3 takes the form: tone=$\overline{BP}\oplus(\overline{K}\cdot F_1\cdot\overline{G}_1\cdot F_2\cdot\overline{G}_2)$. In implementing the above equation, a combinational logic chip 100 is utilized in conjunction with a hex inverter chip 102. The logic chip 100 may be a CMOS chip, RCA, Model No. CD4048, interconnected as shown with the hex inverter chip Model No. CD4049. As illustrated, only input K, $F_1$, $F_2$, $G_1$, $G_2$ and BP are required for the decode. Function control of the logic chip 100 is provided at terminal pins 2, 9, 7 and 10, with pin 10 held in logic "1" by connection to $V_{DD}$. A detailed logic diagram of the combinational logic chip 100 is shown in FIG. 6. A piezoceramic disk 104, such as that utilized in FIG. 2, is connected to the output of the logic chip 100 and inverter chip 102 to provide a tone whenever the decode condition is met. The inverter chip 102 is utilized as an inverter, oscillator and driver for the piezoceramic disk 104. Switch 106 enables logic chip 100 and thus functions as a tone on-off switch. Switch 106 may be separately positioned on the multimeter panel for control by the operator of the meter or simply connected to and controlled by the AC/ohm position of mode selection means 22. Consequently, if a tone mode of operation is not desired, the switch 106 is opened whereas the tone mode is enabled when the switch 106 is closed. In both cases, the display 34 is fully operational.

It is apparent that the decode requirement " _ 00X" is not critical to the application of the invention, and other decode requirements may readily be implemented. For example, instead of a 1% full-scale requirement, a 10% or a 0.1% requirement may be utilized or, indeed, a selection switch may be provided to enable operator selection of the decode between the values 0.1, 1 and 10% or any other values as desired.

A particular advantage of the logic chip 100 and inverter chip 102 is that they provide a self-oscillating output frequency to the piezoceramic disk 104, and thus it is not necessary to utilize the clock pulses from the analog-to-digital converter 32. Further, the oscillator rate may be adjusted by selection of the appropriate resistance and capacitance values on the inverter chip 102.

In operation of the circuit of FIG. 3, the operator merely utilizes the multimeter in a conventional fashion and may optionally close the tone mode switch 106. When the tone mode switch 106 is closed, any reading satisfying the decode condition (" _ 00X", for example) will energize the piezoceramic disk 104 and provide an audible tone to the operator. The operator may thus be aware that the quantity being measured, either voltage, current or resistance values, is less than a predetermined value, e.g., 1% of full scale.

Although the invention has been described in terms of selected preferred embodiments, the invention should not be deemed limited thereto, since other embodiments and modifications will readily occur to one skilled in the art. It is, therefore, to be understood that the appended claims are intended to cover all such modifications as fall within the true spirit and scope of the invention.

What is claimed is:

1. In a meter for measuring an electrical quantity, said meter having a display means and a range selection means defining a plurality of values for said display means for measuring ranges of values of said electrical quantity, the improvement comprising means coupled to and operative with said range selection means for setting a selected reference value of said electrical quantity, means for comparing the value of said measured electrical quantity with said selected reference value of said electrical quantity and means for generating an audible signal in response in said comparison.

2. In a meter for measuring an electrical quantity, said meter having a display means and a range selection means defining a plurality of values for said display means for measuring ranges of values of said electrical quantity, the improvement comprising means coupled to and operative with said range selection means for setting a selected reference value of said electrical quantity, means for comparing the measured electrical quantity with said selected reference value of said electrical quanitity, means operating said meter selectively in first and second comparison modes, and means responsive to said comparison means and said reference selecting means for generating an audible signal when said measured value is above said selected reference value and said meter is in said first comparison mode and for generating the audible signal when said measured value is below said selected reference value and said meter is in said second comparison mode.

3. The meter of claim 1 or 2, further comprising:
   (a) a plurality of scaling resistors;
   (b) input terminals for connection of said scaling resistors in a measurement circuit for measurement of said electrical quantity;
   (c) analog-to-digital converter means for converting an analog voltage from said measurement circuit into a digital value representative of the electrical quantity being measured;
   (d) means connected to said analog-to-digital converter means for displaying said digital value;
   (e) scale change selection means connected to said measurement circuit for enabling selection of different full-scale readings of said display means;
   (f) operation mode selection means connected to said measurement circuit for selecting operation of said multimeter in a tone mode of operation; and
   (g) said audible signal generating means includes means for generating an audible tone in said tone mode of operation is, selectively, higher or lower than a selected reference value.

4. A meter as recited in claim 3, wherein said plurality of scaling resistors forms one leg of a bridge circuit, said bridge circuit having a reference resistor forming another leg thereof, and said tone generating means comprises:

(a) a comparator having a first input connected to said one leg of said bridge circuit and a second input connected to said another leg of said bridge circuit, said comparator providing a first output voltage when said measured electrical quantity has a first predetermined relationship with respect to said selected reference value, and a second output voltage when said measured electrical quantity has a second predetermined relationship with respect to said selected reference value; and
   (b) a tone generator connected to said comparator and responsive to said first output voltage for generating an audible tone and responsive to said second output voltage for preventing generation of said audible tone.

5. A meter as recited in claim 4, wherein said tone generator comprises:
   (a) an oscillator;
   (b) a tone device responsive to electrical oscillations from said oscillator for generating audible tones; and
   (c) gate means connected to receive said first and second output voltages from said comparator for effectively blocking electrical oscillations of said tone device upon receipt of said second output voltages and for permitting oscillations thereof upon receipt of said first output voltage.

6. A meter as recited in claim 5, wherein said tone generator further comprises a frequency transforming circuit connected to said oscillator for providing two different output frequency oscillations, and logic means for combining said two frequency oscillations from said frequency transforming circuit, said tone device connected to said logic means for generating two distinct, periodic audible tones.

7. A meter as recited in claim 5, wherein said frequency transforming circuit is a frequency divided circuit, and said analog-to-digital converter means includes said oscillator.

8. A meter as recited in claim 6, wherein said tone device is a piezoceramic disk.

9. A meter as recited in claim 3, wherein said analog-to-digital converter means provides a plurality of display outputs and said tone generating device comprises:
   (a) decode logic means connected to receive at least some of said display outputs of said analog-to-digital converter means for decoding a display condition of said display means, said decode logic means providing an output signal when said decode condition is satisfied, and
   (b) a tone device connected to said decode logic means for generating said audible tone in response to said output signal.

10. A meter as recited in claim 9, wherein said display means is a multidigit display device and said decode condition corresponds to a predetermined value of at least some of said digits of said display device.

* * * * *

UNITED STATES PATENT AND TRADEMARK OFFICE
CERTIFICATE OF CORRECTION

PATENT NO. : 4,321,530

DATED : March 23, 1982

INVENTOR(S) : Austin T. Kelly et al

It is certified that error appears in the above-identified patent and that said Letters Patent are hereby corrected as shown below:

In the References Cited:

U.S.P.N. 4,096,434, "1/1978" should read -- 6/1978 --.

U.S.P.N. 3,828,252, "7/1974" should read -- 8/1974 --.

Column 5, line 51, "guad" should read -- quad --.

Column 6, line 11, "(2.4 KHz)" should read -- (2.4 Hz) --.

Column 7, line 51, "segmens" should read -- segments --.

Column 8, line 4, "$\overline{(BP)}$" should read -- (BP) --.

Column 8, line 7, "BP" should read -- $\overline{BP}$ --.

Column 8, line 19, "10" should read -- 9 --.

In the Claims:

Claim 5, column 10, line 26, "voltages" should read -- voltage --.

Claim 7, column 10, line 37, "divided" should read -- divider --.

UNITED STATES PATENT AND TRADEMARK OFFICE
CERTIFICATE OF CORRECTION

PATENT NO. : 4,321,530

DATED : March 23, 1982

INVENTOR(S) : Austin T. Kelly et al

It is certified that error appears in the above-identified patent and that said Letters Patent are hereby corrected as shown below:

In the Drawing Figures:

Fig. 1, the whole diagram should be labelled -- 10 --.

Fig. 1, the main dashed line should be labelled -- A-A --.

Fig. 2, "-22V" on the line connected to the lower terminal of resistor 85 should be -- -2.2V --.

Signed and Sealed this

Fourteenth Day of September 1982

[SEAL]

Attest:

GERALD J. MOSSINGHOFF

Attesting Officer       Commissioner of Patents and Trademarks